(12) United States Patent
Miller

(10) Patent No.: US 6,667,625 B1
(45) Date of Patent: Dec. 23, 2003

(54) METHOD AND APPARATUS FOR DETECTING WIRE IN AN ULTRASONIC BONDING TOOL

(76) Inventor: Charles F. Miller, 651 Pathfinder Trail, Anaheim Hills, CA (US) 92665

(*) Notice: Subject to any disclaimer, the term of this patent is extended or adjusted under 35 U.S.C. 154(b) by 62 days.

(21) Appl. No.: 10/035,859

(22) Filed: Dec. 31, 2001

(51) Int. Cl.[7] .................. G01R 31/08; G01R 31/28; B23K 20/10
(52) U.S. Cl. .................. 324/525; 324/527; 324/537; 324/511; 228/104
(58) Field of Search .................. 324/525, 527, 324/537, 73.1, 691, 712, 542, 511; 228/103, 104, 4.5, 102; 73/584, 588

(56) References Cited

U.S. PATENT DOCUMENTS

| | | | |
|---|---|---|---|
| 4,213,556 A | * | 7/1980 | Persson et al. .............. 228/104 |
| 4,555,052 A | * | 11/1985 | Kurtz et al. ................. 228/104 |
| 5,083,087 A | * | 1/1992 | Fox et al. .................... 324/537 |
| 5,227,984 A | * | 7/1993 | Meldrum et al. ........... 702/117 |
| 5,893,508 A | * | 4/1999 | Oh ............................. 228/4.5 |
| 6,039,234 A | * | 3/2000 | Toner ......................... 228/4.5 |

* cited by examiner

Primary Examiner—Anjan K. Deb
(74) Attorney, Agent, or Firm—William L. Chapin

(57) ABSTRACT

An apparatus for detecting whether bonding wire supplied to an ultrasonic bonding tool of an ultrasonic bonding machine is present in a bore of the tool tip and providing an alarm signal if a wire segment normally within the bore is absent because of inadvertent breakage or misfeeding of the wire includes an electronic switching and detection module connected between a machine ground terminal connected to a wire supply reel and a bonding tool electrically isolated from the machine ground. In response to an enable signal input to the module prior to making the first of a pair of ultrasonic bonds to interconnect a pair of binding sites by a bonding wire, electronic switching means within the module electrically isolate the machine ground from the tool, and electric continuity detection means within the module determines whether the tool has been brought to voltage level near that of the machine ground by electrical conductive contact between the wire segment within the tool bore, and the bore wall. Upon removal of the enable signal the electronic switching means reconnects the tool to machine ground preparatory to utilizing the tool to make an ultrasonic bond, or provide an alarm signal and/or halt operation of the machine upon not detecting continuity between the tool and wire supply ground.

23 Claims, 9 Drawing Sheets

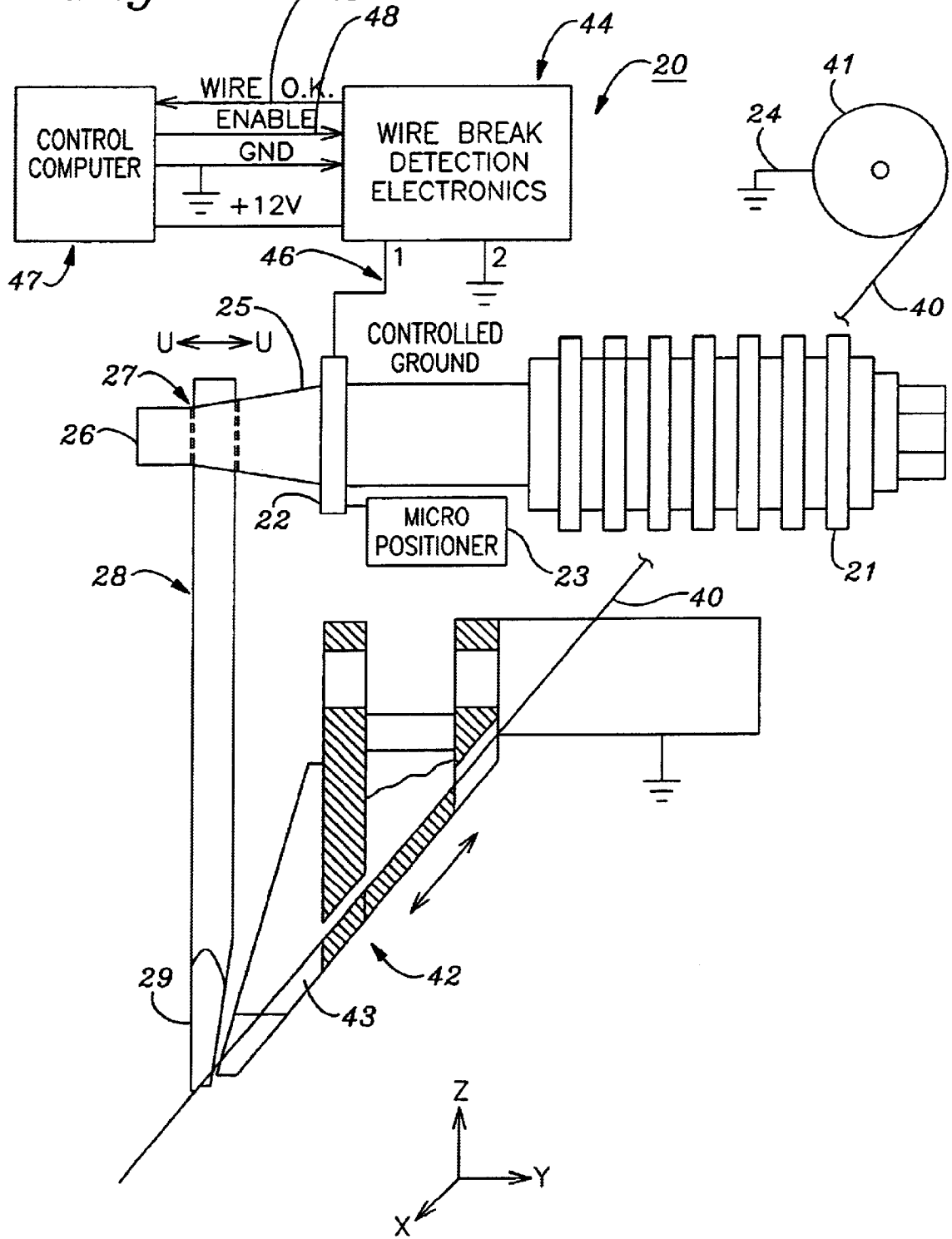

NOTE: 1. IT IS 12V LOGIC
2. WIRE O.K IS A NAND OF U2B PIN 6 AND U2B PIN7

METHOD AND APPARATUS FOR DETECTING WIRE IN AN ULTRASONIC BONDING TOOL

BACKGROUND OF THE INVENTION

A. Field of the Invention

The present invention relates to ultrasonic bonding machines of the type used to bond interconnecting wires to miniature electronic devices such as integrated circuits and magnetic read/write heads used in disk drive memories. More particularly, the invention relates to a method and apparatus for detecting absence of a bonding wire within the bore of an ultrasonic bonding tool, because of inadvertent breakage or miss-feeding of a bonding wire being used to make interconnections between bond sites.

2. Description of Background Art

Miniature electronic circuits, or "micro-circuits," are used in vast quantities, in a wide variety of consumer, commercial, industrial and military devices and equipment. The majority of such micro-circuits are of a type referred to as integrated circuits. Integrated circuits contain a number of active circuit elements such as transistors, and passive elements such as resistors and capacitors mounted on a substrate. Semiconductor integrated circuits consist of a small monolithic chip made of a semiconducting material such as silicon having discrete areas into which impurities are diffused to form circuit elements and having conductive paths between circuit elements on the chip formed by selectively etching metallized layers of the chip. In hybrid micro-circuits, circuit elements mounted on a ceramic substrate are usually interconnected by conductive ink paths on the substrate.

Functional portions of integrated circuits are typically in the form of very small, rectangular-shaped chips, ranging in size from 0.025 inch to 0.200 inch or more on a side. Input connections to integrated circuit chips are often made by bonding a very fine wire to conductive pads on the chips, the other end of each wire being bonded to a conductive terminal that is sufficiently large and robust to be soldered to conductors on a circuit board. Wire bonding of this type utilizes ultrasonic energy and/or heat to form an intermetallic bond or weld between the wire and metallic bond site. Such wire bonds are used to form interconnections between pads of an integrated circuit chip and terminals of a package used to enclose and protect the chip, and are also used to connect lead-out terminals to delicate read/write heads used in disk memories.

Bonding wires used to interconnect the pads of a semiconductor chip to terminals of a package containing the chip are generally made of aluminum or gold, and have a diameter of about 1 mil (0.001 inch) or less. Each interconnecting wire must be bonded to the upper surface of a small, typically rectangular-shaped, integrated circuit pad a few mils wide at one end of the wire to form a first bond site, and to a similarly shaped, larger package terminal comprising a second bond site.

The most common method of interconnecting wires between semiconductor chip pads and external terminals uses ultrasonic energy to form a welded bond at each end of a conducting wire. To form such bonds, the free end of a length of bonding wire is placed in contact with a pad. Then the tip of an ultrasonic transducer is pressed against the wire, and energized with ultrasonic energy for a short time interval. The combination of a normally downwardly directed pressure applied by the tool to the contact region between the lower surface of the wire and the upper surface of the pad, combined with a rapid lateral scrubbing action of the tool tip in a horizontal direction parallel to the pad, causes an inter-molecular diffusion bond, sometimes referred to as a "weld," to be formed between the wire and pad. The free end of the bonded wire is then moved to another pad or terminal, and bonded thereto by the same process. After the last bond in a series of bonds has been thus formed, the wire is severed at the last bond site.

In view of the very small sizes of both the micro-circuit pads and bonding wire, it can be appreciated that ultrasonic bonding of connecting wires to integrated circuit pads must be performed using a tool mounted in a bonding machine that permits the tool to be manipulated to precisely controllable positions within a work area containing a workpiece.

Typical wire bonding machines used for ultrasonic welding of wires to micro-circuit pads include an elongated, generally cylindrically shaped force-applying member or "tool." The tool is usually vertically disposed, and has a shank fastened at the upper end thereof to a source of ultrasonic energy, such as a piezoelectric transducer which is connected to an electrical energy source alternating at an ultrasonic frequency. Usually, the tool is connected to the transducer through a tapered horn structure that matches the acoustic input impedance of the tool to the output impedance of the transducer, which typically has a larger diameter than the tool shank.

One type of ultrasonic bonding tool used to bond wires to micro-circuit pads is referred to as a wedge bonder and has a flat lower working face adapted to press a bonding wire into contact with a pad, while ultrasonic energy is applied through the tool to the wire to form an ultrasonic weld. This working face is usually quite small, typically having a rectangular shape only about a few mils on a side, to permit bonding wire to small micro-circuit pads, without contacting adjacent circuit elements. The bonding process typically includes the steps of first viewing a particular workpiece pad and tool tip in a stereo microscope and video camera to align a workpiece relative to a bonding machine, and then using an automatic actuator system to position the tool tip at consecutive bond site locations on the workpiece, using a control system which employs pattern recognition logic.

In most wire bonding machines, the bonding tool is so constructed as to facilitate the positioning of bonding wire over a pad, prior to performing the bonding operation. Such bonding tools may include an upwardly angled lower face rearward of the working face, and a generally vertically disposed rear face. An angled bore or wire guide hole having an entrance aperture in the rear face and an exit aperture in the angled lower face of the tool enables bonding wire supplied from a reel mounted upwardly and rearwardly of the tool to be paid out through the exit aperture in the angled lower face of the tool. Typically, a remotely actuable clamp located rearward of the wire guide hole entrance and movable with respect to the tool is used to feed bonding wire through the guide hole.

The clamp used to push wire through the guide hole of a bonding tool usually consists of a pair of jaws or clamp blades that may alternately be closed to grip the wire, and opened to allow free travel of the wire. Generally, such clamps may be moved toward and away from the guide hole entrance, typically on a line of movement which coincides with the axis of the guide hole. To feed wire through the guide hole, the jaws of the clamp are first opened, and the clamp then moved away from the guide hole. The jaws are then closed to grip the wire, and then moved towards the guide hole, thus feeding wire through the guide hole.

In wire bonding machines of the type just described, the machine is used to translate the bonding tool to the proper position to bond wire to a first bond site of a pair of bond sites, such as a pad on an integrated circuit die, feed wire out through the guide hole exit aperture, move the tool to a second bond site and form a second bond. In this manner, any desired number of pads or other elements of a circuit can be connected together, in a procedure referred to as "stitch" bonding. After the second or last bond in a series of bonds has been made, the wire must be severed, to permit making bonds between other pairs of bond sites. In one method of severing the wire, the clamp blades are then closed upon wire rearward of the bonding tool, and the clamp is translated rearwards from a second bond site to exert tension on the bonding wire sufficient to sever the wire. The clamp is then fed forward to feed a new length of wire from the tool. Alternatively, the wire may be severed by a "table tear" method, in which a table or platform holding a workpiece is translated forward from the tool to tension and thereby sever the wire, while the wire is held by closed clamp blades.

In moving a wedge bonding tool from a first bond site to a second bond site, the tool must be translated rearward from the first site to the second site, in a vertical plane containing both the longitudinal axis and wire-guide bore axis of the tool. This requirement results from the fact that wire paying out forwardly through the exit aperture of the bonding tool tip must remain in the plane containing the longitudinal and guide hole axes of the tool, to ensure that the wire will not bind on the exit aperture chamfer, or become twisted.

Because of the requirement for translating a wedge bonding tool from a first to subsequent bond sites in the plane of the bonding tool longitudinal axis and wire guide bore axis, existing wedge bonding methods require that a workpiece be rotated to align a direction vector between the two sites with the bonding tool plane, and subsequent translation of the bonding tool rearwardly in that plane along the direction vector.

One method of performing the required relative translations and rotations of a wedge bonding tool relative to a workpiece utilizes a support platform for the workpiece, which is translatable in an X-Y plane perpendicular to the longitudinal axis of the bonding tool, and rotatable in the Y-Y plane. With this method, the bonding tool need only be translatable downwardly, in a minus –Z direction to effect a bond, and upwardly in a plus+Z direction after a bond has been made.

The manufacture of production quantities of microcircuits generally requires the use of automated ultrasonic bonding machines performing bonding operations of the type described above, to achieve satisfactory production rates at reasonable unit costs per circuit. An example of such automated ultrasonic bonding machines is disclosed in the present inventor's application Ser. No. 09/570,196, filed May 12, 2000, for an Automatic Ultrasonic Bonding Machine With Vertically Tiered Orthogonally Translatable Tool Support Plafforms. The disclosed machine includes a positioning mechanism for automatically translating the tip of an ultrasonic bonding tool by drive motors to precisely pre-determinable positions within a three-dimensional coordinate space containing a workpiece. The machine described in that application also provides means for translating a bonding tool in X-Y directions parallel to a plane containing a workpiece to position the tool tip over a particular bond site, translating the tool downwardly in a minus –Z direction to make an ultrasonic wire bond, translating the tool upwardly to withdraw the tool tip from the first bond site, and translating the tool in X-Y direction to position the tip over a subsequent intended bond site, and form thereat a subsequent bond. Thus, the disclosed machine eliminates the a requirement for a rotatable X-Y table for supporting a workpiece, and provides a highly effective method for making bonds on workpieces located on a conveyor, for example.

Operation of automated ultrasonic bonding machines typically requires an operator to select a pre-programmed operation cycle for the machine and arrange for a quantity of workpieces to be automatically presented to the machine, on a conveyor, for example. Pattern recognition logic is then used to position alignment targets of a workpiece precisely with respect to an ultrasonic bonding tool, whereupon a sequence of automatic bonding operations joining individual interconnecting wires between a plurality of a first and second bond sites may be initiated. Each work piece may require bonding dozens or even hundreds of individual interconnecting wires between pairs of separate bond sites.

In ultrasonic bonding an interconnecting wire between a pair of first and second bond sites, a length of wire which enters an entrance opening of a bore through the tool tip from a supply reel and protrudes from an exit opening of the bore located rearwards of a front foot of the tool is pressed down between the foot and a first bonding site such as a conductive pad on an integrated circuit chip. Ultrasonic energy is then applied to the tool, causing the tip of the tool to vibrate fore and aft at an ultrasonic frequency. Scrubbing action of the lower surface of the wire against the pad causes the contacting surfaces between the pad and wire to be ground together. This scrubbing action in turn results in the plastic deformation of microscopic surface protrusions, pushing the peaks of the protrusions into valleys of a contacting surface, dispersing impurities from the surfaces and bringing nascent molecules of the wire and pad so close together that they intermingle and form a solid-state diffusion bond. Even though such bonds are formed at room temperature, they are sometimes referred to as welds. The bond or weld secures the wire to the pad mechanically and in electrically conductive contact with each other. The tool tip is moved upwards from the first bond site, and translated rearward from the first bond site to position the tool tip foot over a second bond site, such as a terminal pad. The bonding tool is again moved downwards to press the length of wire against the second conductive pad, and ultrasonic energy once again applied to the tool tip to effect a second bond.

After a pair of bonds has been made as described above, a continuous length of bonding wire interconnects the first and second bond sites, and trails rearward away from the second bond site under the tool. The trailing portion of wire must be severed by either of two methods, to finish the interconnection and prepare the bonding tool to make another pair of first and second bonds. According to one method of severing a wire at a second bond site, jaws of a wire clamp located behind the tool are closed to grip the wire between the tool and a wire supply reel, and the clamp moved rearward to exert tension on the wire sufficient to break the wire. According to another method of severing a wire at a second bond site, sometimes referred to as a "table tear," a clamp secures the length of wire rearward of the tool, and a platform or table to which a workpiece is secured is translated forward from the tool. In both methods, tension exerted on wire causes it to break at the rear area or heel of the second bond.

After a length of bonding wire from a supply reel has been severed at a second bond site by either of the two methods described above, the wire clamp rearward of the tool is moved forward to feed wire outwardly through the bonding tool bore a distance sufficient to underlie the front foot area of the bonding tool, thus positioning the wire correctly for initiating another first bond of a pair of bonds.

A problem which can occur using automatic ultrasonic bonding of the type described above is accidental breakage of a length of bonding wire rearward of the bonding tool. Such breakage can be caused by imperfections in the wire supply from the reel, causing the wire to be weakened, excessive tension being exerted on the wire by the supply reel, or other such causes. Such accidental breakage of wire is quite problematic, for the following reasons.

In automatic ultrasonic bonding, the ultrasonic bonding tool is brought forcibly down against a length of bonding wire, to scrub the lower surface of the wire against a bonding site and thereby form a bond. If bonding wire is absent from its proper location below the foot of the bonding tool, the foot will directly contact and scrub the bonding site surface. This direct scrubbing action of a bonding tool foot on an integrated circuit pad or terminal pad generally degrades the surface to the extent that adequate wire bonds may not subsequently be made to the pad. Thus, even if the absence of wire is detected and bonding wire re-threaded into the bonding tool, the workpiece must usually be scrapped. Therefore, by the time an operator discovers by physical inspection that bonding wire from a supply reel has broken rearward of the bonding tool bore, a large number of workpieces may have been ruined. Accordingly, it would be desirable to provide means for detecting inadvertent breakage of a bonding wire at the time of its occurrence, so that a production run and ultrasonic bonding machine may be shut down to permit re-threading of the broken bonding wire into the bonding tool bore.

A number of schemes have detecting broken or missing wires in ultrasonic bonding machines have been proposed. For example, Toner in U.S. Pat. No. 6,179,197, Jan. 30, 2001, Missing Wire Detector discloses a method and apparatus for monitoring the presence of a bonding wire in a wire bonding machine in which an AC signal, specifically, the A.C. ultrasonic drive signal for the ultrasonic transducer of an ultrasonic bonding tool is coupled to a terminal of a peizorestive transducer from an ultrasonic drive current generator through a first, upper, input current sensing resistor, the other terminal of the transducer being electrically coupled to the transducer horn, which is connected to ground return for the current generator through a second, ground path current sensing resistor. When a bonding tool wedge is in electrically conductive contact through bonding wire and a feed clamp to a ground reference, current through the ground path resistor is less than that through the upper input current sensing resistor by about 15% confirming that the bonding wire is present. If the current difference is less than 15%, a voltage comparator connected to the high ends of the input current and output sampling resistors generates a warning signal indicating that bonding wire is not present. The disclosed method requires that the ultrasonic transducer and wedge be permanently electrically isolated from ground, and that an ultrasonic voltage be applied to the workpiece.

Some microcircuits are so delicate that even minute voltages applied to the circuit during bonding will damage or destroy the circuit. Accordingly, certain limitations of prior-art missing wire detection schemes, such as the requirement to apply an electric potential to a workpiece, were motivating factors in the present invention.

OBJECTS OF THE INVENTION

An object of the present invention is to provide an apparatus for detecting the absence of a bonding wire within the bore of an ultrasonic bonding tool.

Another object of the invention is to provide an apparatus for detecting the presence of a bonding wire within the bore of an ultrasonic bonding tool which includes means for electrically detecting electrical continuity between a segment of bonding wire within the bore, and the bore wall.

Another object of the invention is to provide an apparatus for detecting the presence of an ultrasonic bonding wire within the bore of an ultrasonic bonding tool tip, which includes means for alternately electrically conductively connecting and disconnecting the tool to a source of bonding wire supplied to the tool, and means for electrically detecting electrical continuity between a segment of the bonding wire located within the bore, and the bore walls during a time period when the bonding wire source is electrically disconnected from the tool.

Another object of the invention is to provide an apparatus for detecting the presence of an ultrasonic bonding wire within the bore of an ultrasonic bonding tool tip that includes means for electrically detecting electrical continuity between a segment of bonding wire within the bore and the bore wall, and means for vibrating the tool to move it relative to the wire segment sufficiently for contact to be made between the wire segment and bore wall.

Another object of the invention is to provide a method for detecting the presence of a segment of bonding wire within the bore of an ultrasonic bonding tool tip comprising the steps of electrically conductively grounding an ultrasonic tool during formation of an ultrasonic bond, ungrounding the tool after formation of a bond, determining by electrical measurement means whether electrical continuity exists between a source of bonding wire for the tool, and the wall surface of a bore within the tip of the tool and a segment of wire within the bore continuous with wire from the source, and re-grounding the tool preparatory to making another ultrasonic bond.

Another object of the invention is to provide a method for detecting the presence of a segment of bonding wire within the bore of an ultrasonic bonding tool tip comprising the steps of electrically conductively grounding an ultrasonic tool during formation of an ultrasonic bond, ungrounding the tool after formation of a bond, vibrating the tool tip at an amplitude sufficient to cause the wall surface of the bore to at least intermittently contact a wire segment within the bore, determining by electrical measurement means whether electrical continuity exists between a source of bonding wire for the tool, and the wall surface of a bore within the tip of the tool and a segment of wire within the bore continuous with wire from the source, and re-grounding the tool preparatory to making another ultrasonic bond.

Various other objects and advantages of the present invention, and its most novel features, will become apparent to those skilled in the art by perusing the accompanying specification, drawings and claims.

It is to be understood that although the invention disclosed herein is fully capable of achieving the objects and providing the advantages described, the characteristics of the invention described herein are merely illustrative of the preferred embodiments. Accordingly, I do not intend that the scope of my exclusive rights and privileges in the invention be limited to details of the embodiments described. I do intend that equivalents, adaptations and modifications of the invention reasonably inferable from the description contained herein be included within the scope of the invention as defined by the appended claims.

SUMMARY OF THE INVENTION

Briefly stated, the present invention comprehends a method and apparatus for detecting the absence of a bonding wire within the bore of an ultrasonic bonding tool tip of an ultrasonic bonding machine and providing an alarm signal in that absence to thereby alert an operator that the bonding wire must be re-threaded into the tool to enable wire bonds to be made, and/or providing a halt signal to halt operation of the bonding machine until re-threading has been effected.

An apparatus for detecting broken or missing bonding wire according to the invention includes a switching and detection electronics module having a first terminal connected to a bonding wire supplied from a reel or other such supply source, and a second terminal connected to the ultrasonic bonding tool. In one embodiment the wire and supply reel are connected to ground, while the tool is electrically isolated from the chassis and other components of the bonding machine. The electronics module includes an electronically controlled switch, preferably a field effect transistor (FET), which, in a quiescent state of the module, conductively couples the bonding tool to chassis ground through the low impedance of the FET in its on-state. The electronics module also includes a FET driver circuit which turns off the FET switch upon receiving an external enable signal, disconnecting the tool from ground. Also included in the electronics module is a time delay circuit which produces a time-delayed enable signal upon receipt of the external enable signal, the time delay enable being coupled to one input of a two input NAND gate. The other input of the NAND gate is connected to the output terminal of an inverting ground detection buffer amplifier, an input terminal of which amplifier is connected to the bonding tool and a positive voltage source through a pull-up resistor. The output terminal of the NAND gate is connected to a module output terminal designated WIRE O.K.

When wire from a supply reel connected to chassis ground is in electrically conductive contact with the wall of the bonding tool bore, a low voltage level at the input terminal of the ground detection circuit produces a logic TRUE level at the output terminal of the detection circuit, which when NANDED with the delayed enable signal produces a LOW, TRUE signal at the output of the NAND gate, the LOW signal level being interpreted as signifying presence of a bonding wire contacting the tool. If wire is absent from the tool bore, the input terminal of the detector circuit is raised to a logic TRUE level by the pull-up resistor connected to a positive voltage, causing the output of the detector circuit to go FALSE, which in turn causes the output of the NAND gate and WIRE O.K. terminal to go to a high, FALSE state, indicating a broken or absent wire and triggering an alarm and/or halting automatic operation of the machine. The time-delayed ENABLE ensures that the FET switch has disconnected the tool from chassis ground prior to the time that the tool voltage is monitored to determine if the tool voltage has indeed been lowered by contact with a grounded bond wire, rather than by the FET switch still being in its ON state.

A method of detecting a broken or missing wire within the bore of an ultrasonic bonding tool according to the present invention includes providing from an external source such as a computer under software control an external ENABLE signal to the electronics module to momentarily electrically isolate the tool from ground for an input ENABLE period prior to forming a first bond, and determining by electrical measurement means whether the tool has been brought to a low, near-ground logic level at least momentarily during a time-delayed ENABLE period, by electrical contact made between a wire within the bore of the tool and the bore walls, a positive continuity test result producing a WIRE O.K. signal.

In an alternate embodiment of the apparatus and method, the ultrasonic bonding tool is permanently grounded, and the wire and supply reel are alternately electrically isolated from and connected to ground by the FET switch.

In a preferred embodiment of the method used with bonding tool wedges having a relatively shallow wire feed angle with respect to a workpiece, the tool is vibrated, preferably by energizing its ultrasonic drive transducer during the enable period, thus assuring that a wire within the bore of the tool will at least momentarily contact the tool bore wall and thus signify its presence therein. Upon completion of the enable period, the tool is once again grounded, and a bonding cycle initiated provided that a WIRE O.K. signal is detected.

In an embodiment of the invention suitable for use with deep access bonding tools which have bores which make relatively large angles to a workpiece, a wire feed bore disposed longitudinally through the shank of the tool and which bonding wire passes through before entering the rear entrance to the steeply angled tool tip bore has installed therein a thin insulating tube, to ensure that the wire comes into electrical contact within the tool only when within its angled tip bore.

BRIEF DESCRIPTION OF THE DRAWINGS

FIG. 1 is a fragmentary, partly schematic sectional view on an enlarged scale of an apparatus for detecting broken bonding wires according to the present invention, including an ultrasonic wire bonding system using a shallow angle wedge bonding tool.

DESCRIPTION OF THE PREFERRED EMBODIMENTS

Figure 2A:
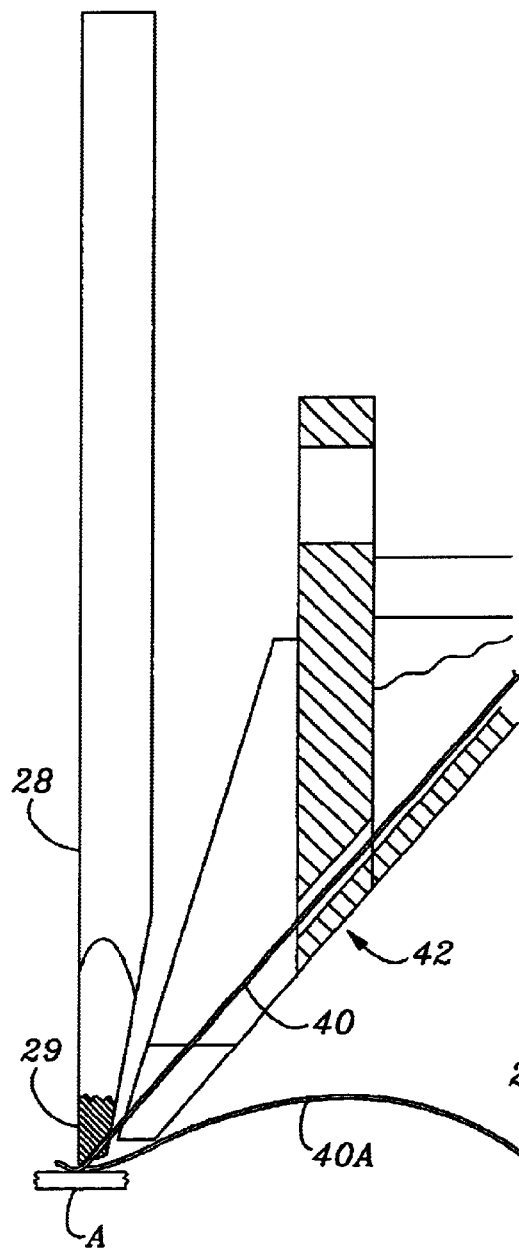
FIG. 2 is a fragmentary view of the apparatus of FIG. 1, on a further enlarged scale, showing the bonding tool thereof moved to a second bond site.

FIGS. 1–12 illustrate a method and apparatus for detecting broken ultrasonic bonding wires according to the present invention.

Referring first to FIG. 1, an apparatus 20 for detecting broken ultrasonic bonding wires may be seen to include an ultrasonic transducer 21 such as a piezoelectric transducer, which is energizable by an electrical current alternating at an ultrasonic frequency. Transducer 21 is mounted by an electrically conductive, e.g., metal, clamp 22 to a part of an ultrasonic bonding machine, e.g., to a micropositioner 23 comprising part of the machine. Clamp 22 is electrically isolated from the chassis ground 24 of the machine. Referring still to FIG. 1, it may be seen that transducer 21 has a generally cylindrical shape, and includes a coaxial, forward protruding impedance matching horn portion 25. The latter has disposed vertically therethrough, near front end face 26 thereof, a laterally centrally located, vertically disposed bore 27. Secured within bore 27 of horn 25 is the shank of an elongated, generally cylindrically shaped wedge bonding tool 28. Tool 28 has a lower, generally wedge-shaped tip 29. As may be seen best by referring to FIG. 3, tool tip 29 has a front "foot" portion 30 having a generally horizontally disposed flat lower surface 31, an arcuately radiused toe 32, and an arcuately radiused heel 33. Tool 28 also has a rear lower portion 34 which is angled obliquely upwardly and rearwardly of front foot portion 30, and a rear longitudinal portion 35 which angles more nearly vertically upward and rearward from the rear lower portion.

Figure 2B:
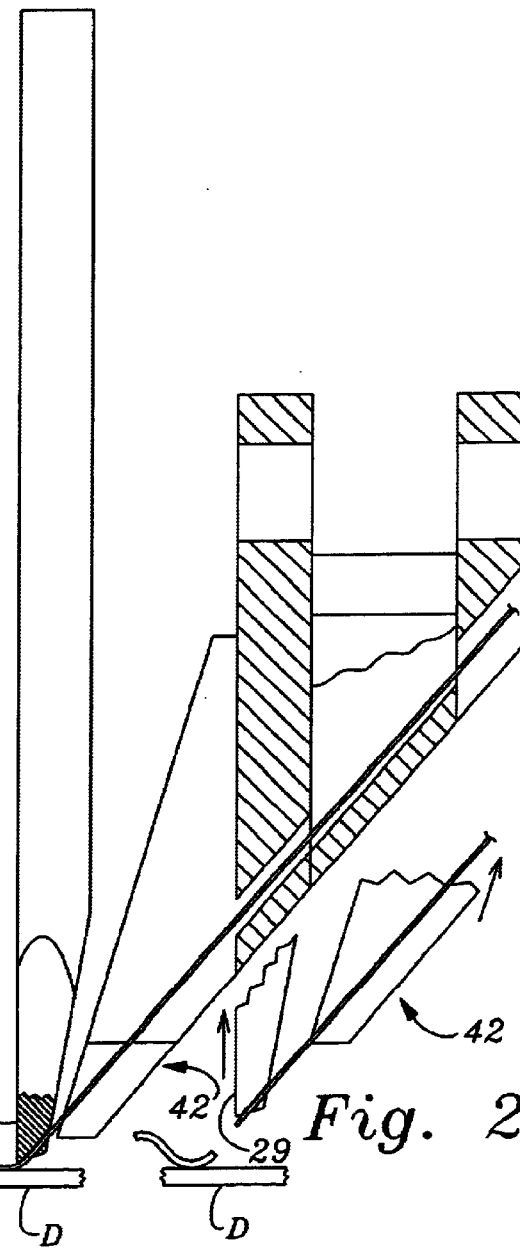
Figure 2C:
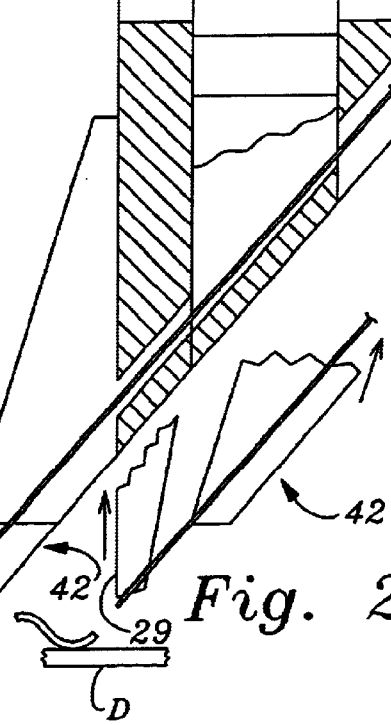
Figure 3:
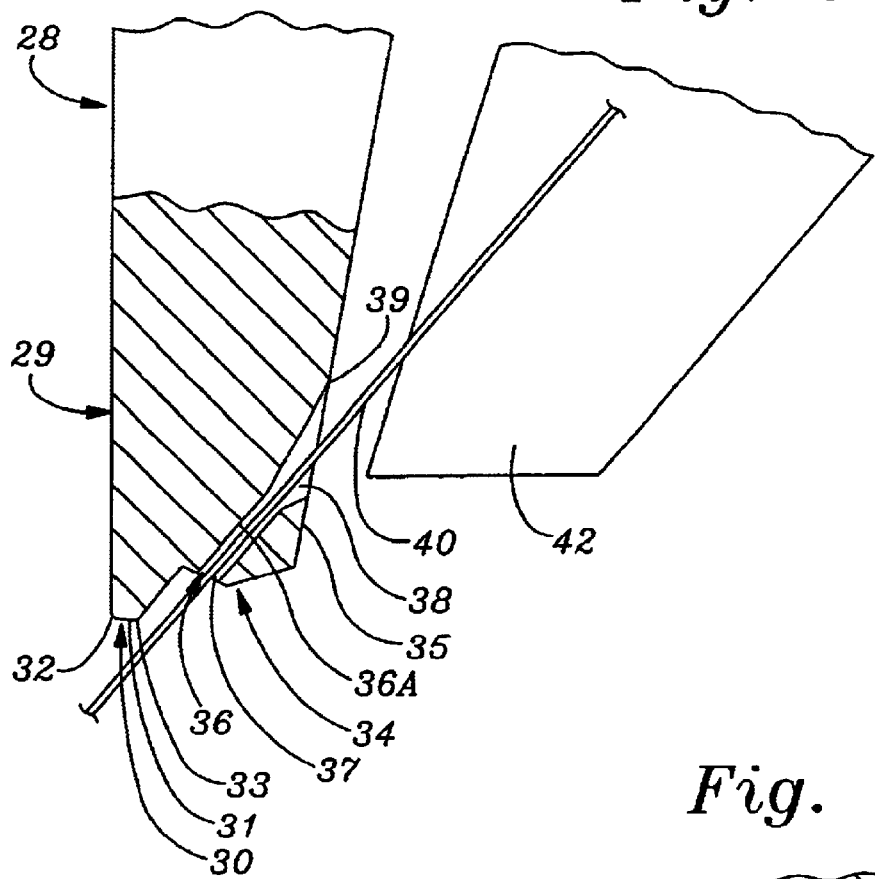
FIG. 3 is a fragmentary view of the structure of FIG. 2, on a further enlarged scale, showing a wire correctly severed preparatory to making another first bond.

Referring still to FIG. 3, it may be seen that tip 29 has disposed obliquely downwardly and forward through a lower rear portion thereof a circular cross section bore 36. Bore 36 has a generally circular exit opening 37 located obliquely upwardly and rearwardly of foot 30, and a funnel-shaped entrance bore 38 which diverges to an opening 39 in rear wall 35 of larger diameter than bore 36. Funnel-shaped entrance bore 38 and enlarged entrance bore opening 39 thereto are provided to facilitate threading a length of bonding wire 40 into bore 36, and out through exit bore 37 to underlie front 30. As shown in FIG. 1, wire 40 is supplied by a rotatable supply reel 41 through a clamp mechanism 42, the left hand or (−X) jaw 43 of which is shown in FIG. 1, and schematically in FIGS. 2 and 3. Clamp jaw 43 functions cooperatively with a generally symmetrically shaped, right hand clamp jaw (not shown) to alternately grip and release wire 40, as well as move diagonally backwards and forwards, enabling the wire to be gripped and pulled diagonally upwardly and rearwardly, to break a wire at a second bond location, and pushed diagonally downwardly and forward, to push a desire length of wire under bonding tool tip 30, preparatory to making another first bond.

As shown in FIG. 1, at least one and preferably both wire reel 41 and clamp mechanism 42 are in electrically conductive contact with chassis ground 24 of apparatus 20. Also, as shown in 3, wire 40 within bore 36 of tool tip 39 has a diameter only slightly smaller than that of bore, e.g., 1 mil vs 2 mils. Thus, as shown in FIG. 3, wire 40 will electrically conductively contact bore wall 36A if the wire is angled or bent even slightly with respect to the longitudinal axis of the bore. Moreover, the present inventor has determined that if normal transducer drive power is applied to tool 28 with wire 40 in a disposition preparatory to forming a first bond, as shown in FIG. 3, electrical contact will always be made between the wire and bore wall 36A, even if only momentarily, owing to the relative motion between the tool and wire and the inertia of the wire.

Figure 4:
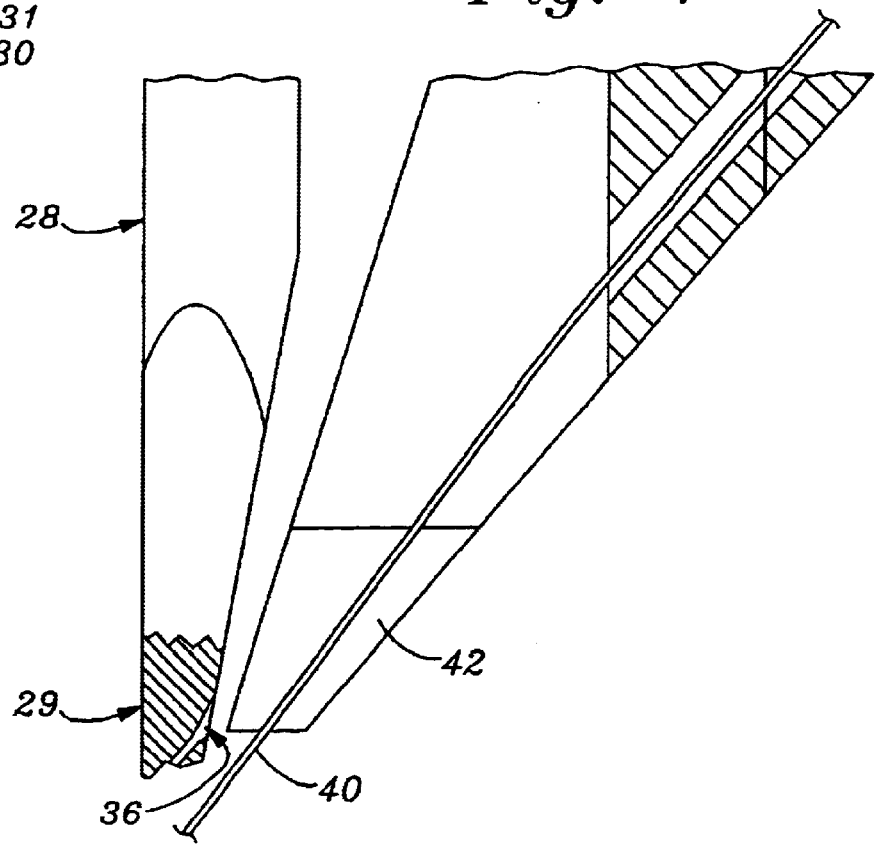
FIG. 4 is a view similar to that of FIG. 3, but showing a broken bonding wire.

FIGS. 2–4 illustrate bonding operations of components of apparatus 20 shown in FIG. 1.

As shown in FIG. 2A, tip 29 of bonding tool 28 presses bonding wire 40 against a first bonding site, e.g., a conductive pad A of an integrated circuit B. Electrical current alternating at an ultrasonic frequency is then input to transducer 21 (FIG. 1), causing the transducer and tool tip 29 to vibrate at an ultrasonic frequency, thus scrubbing wire and pad A together to thereby form a first ultrasonically welded bond C. Next, as shown in FIG. 2B, tool tip 29 is raised a short distance above first bond C and moved laterally rearwards to position the tip above a second bond site, e.g., a package terminal D. During this step a length of wire 40A pays off reel 41 and out through tool tip bore 36. Next, tip 29 is moved downwards to press a rear portion of wire length 40A against terminal D, and ultrasonic energy once again applied to the tip to effect a second bond E. Then, as shown in FIG. 2C, the jaws of clamp 42 are closed to grip bonding wire 40, and moved rearward, exerting tension on the tail portion of wire length 40A rearward of second bond E sufficiently to break the wire. Finally, as shown in FIG. 3, clamp 42 is moved forward to feed an appropriate length of bonding wire beneath foot 30 of bonding tool tip 29, whereupon the clamp jaws are opened, preparing the machine to effect another first bond in a pair of bonds. FIG. 4 illustrates a fault condition in which bonding wire 40 has accidentally broken rearward of tool tip bore 36, in which case the bonding wire has been improperly fed forward outside of the bore and is not correctly positioned to make a bond.

Referring again to FIG. 1, it may be seen that broken wire detection apparatus 20 according to the present invention includes an electronic switching and detection electronics module 44. Module 44, shown in block diagram form in FIG. 5 and schematically in FIG. 6, includes a machine interface input ground terminal 45 electrically conductively connected to chassis ground 24 of apparatus 20, and a machine interface "Controlled Ground" terminal 46 electrically conductively connected to transducer support clamp 22. As shown in FIG. 1, switching and detection module 44 is electrically interfaced with a control computer 47.

Figure 5:
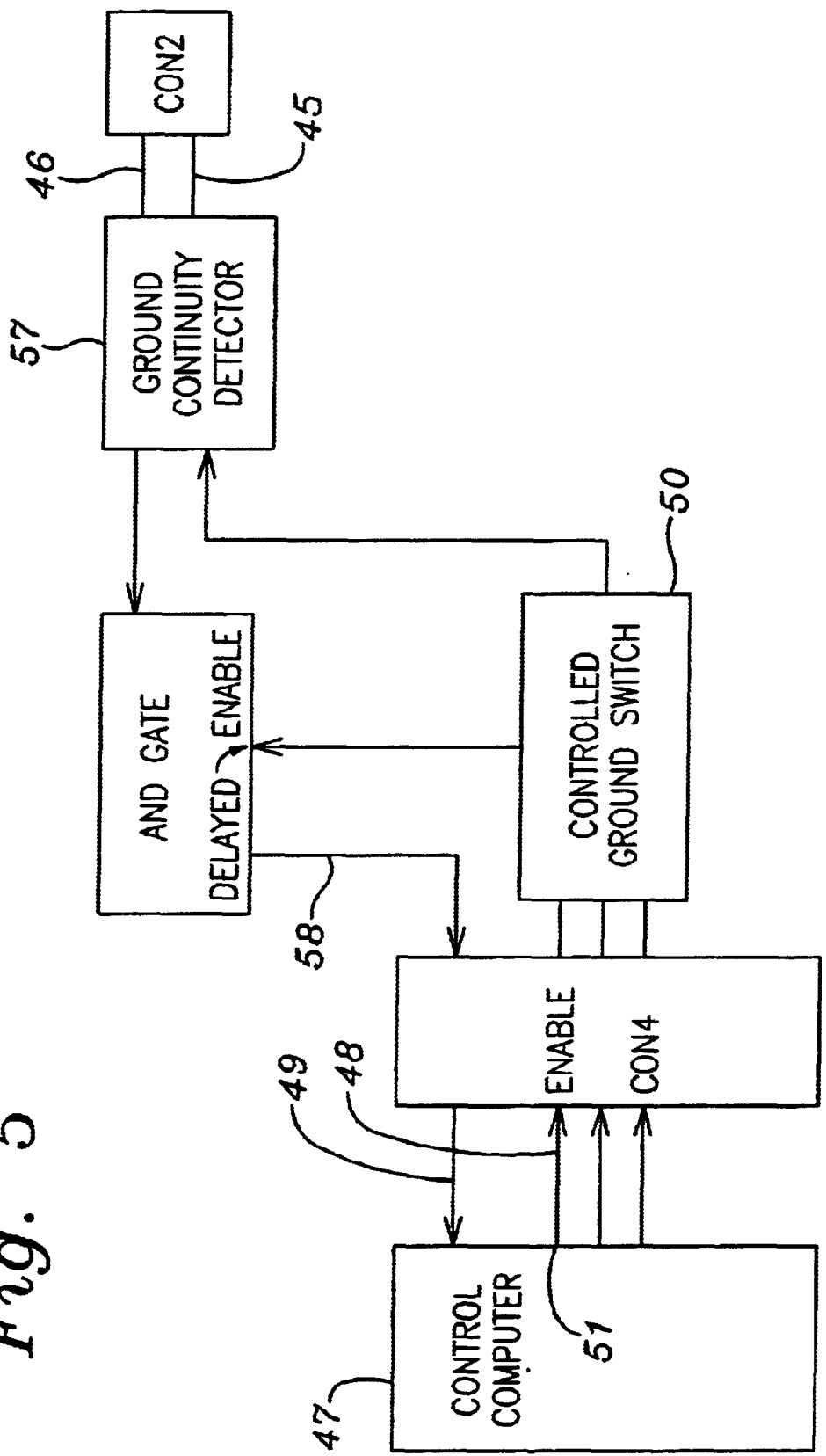
FIG. 5 is a block diagram of an electronic switching and detection module comprising part of the broken bonding wire apparatus of FIG. 1.
Figure 6:
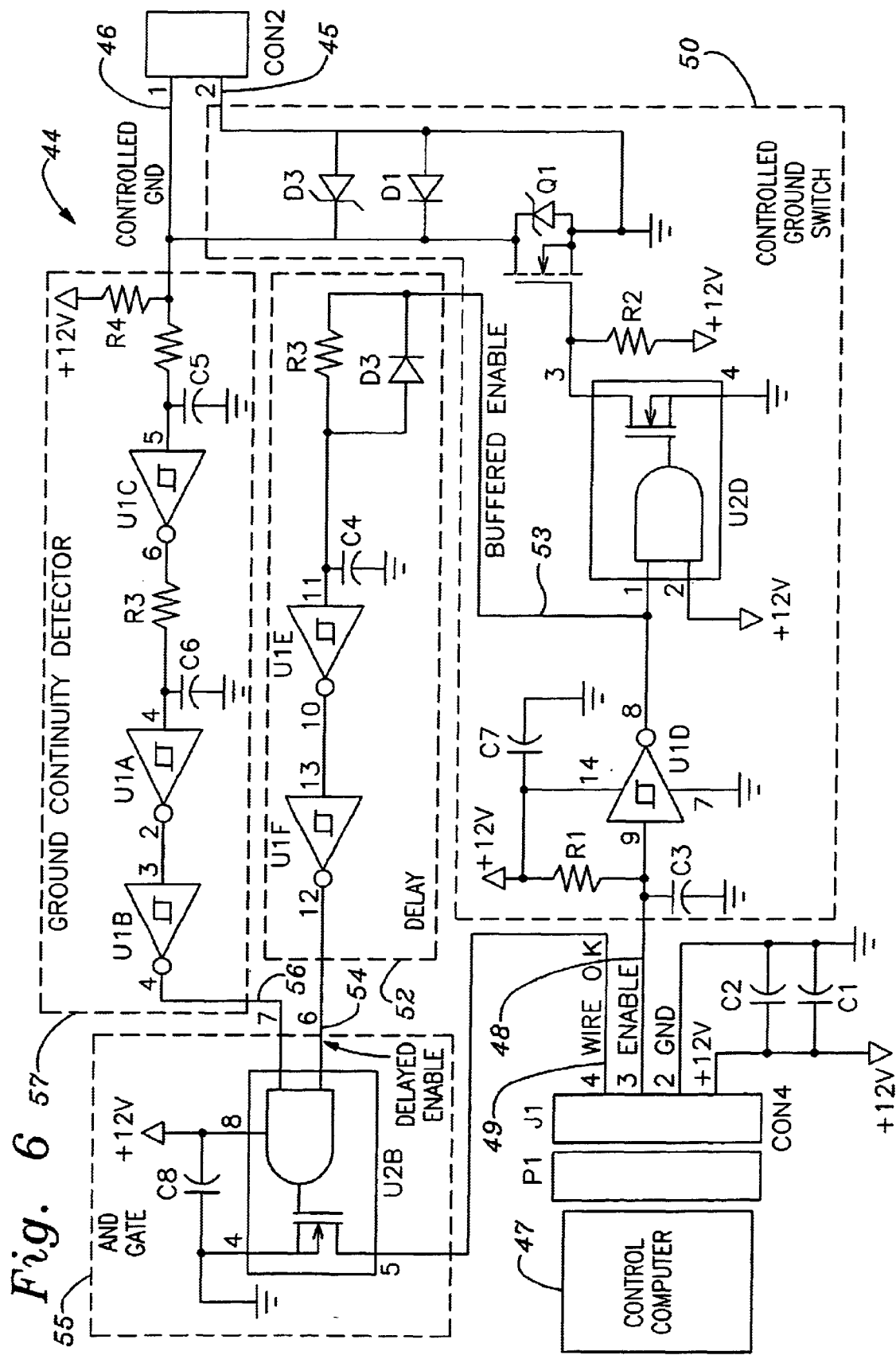
FIG. 6 is a schematic diagram of the electronic switching and detection module of FIG. 5.

As shown in FIGS. 5 and 6 and described in further detail below, electronic switching and detection module 44 contains electronic switching circuitry which, in its quiescent state, provides a low impedance path between terminals 45 and 46 connected to transducer support clamp 22 and chassis ground, respectively, thus grounding transducer 25 and bonding tool 28 during formation of wire bonds on a workpiece. Module 44 also has a computer interface terminal 48, which when provided with an appropriate signal from control computer 47, causes electronic switching circuitry in module 44 to switch to a high impedance state, effectively disconnecting chassis ground terminal 45 from controlled ground terminal 46, and therefore from transducer 25 and bonding tool 28. However, if bonding wire 40 has a segment 40B present within bore 36 of bonding tool 28, electrical contact is made between grounded bonding wire 40 and the tool, either statically, or intermittently if the transducer is momentarily energized to vibrate the tool relative to the wire. Detection electronics within module 44 senses the static or intermittent ground condition at controlled ground terminal 46, issuing a WIRE O.K. signal level at terminal 49 of module 44. The presence of a true WIRE O.K. signal at terminal 49 of module 44 signifies to control computer 47 that bonding wire 40 is present within bore 36 of bonding tool 28, enabling the computer to issue machine commands resulting in the formation of a next pair of first and second bonds. Absence of a WIRE O.K. signal is utilized by control computer 47 to halt further bonding attempts and issue an operator alarm signal.

A more detailed understanding of the structure and function of electronic switching and detection module 44 may be obtained by referring to FIGS. 5–7 in conjunction with the following description. As shown in FIG. 5, electronic switching and detection module 44 includes a controlled ground switch block 50 which includes a field effect transistor (FET) Q1 which in a quiescent state of module 44 is in ON-state that provides a low impedance path between chassis ground terminal 45 and controlled ground terminal 46. When an active low ENABLE signal 51 is issued from control computer 47 to ENABLE input terminal 48 of module 44, Q1 is turned off, thereby inserting a high impedance between chassis ground terminal 45 and controlled ground terminal 46.

Module 44 also includes a Delayed Enable block 52 which receives a Buffered Enable signal 53 from Controlled Ground Switch Block 50, and produces in response thereto a true Delayed Enable signal 54 delayed, e.g., 6 milliseconds, from the leading edge of Buffered Enable signal 53.

Delayed Enable signal 54 is input to a first terminal of a two-input NAND gate block 55, which has a second input terminal connected to the buffered and inverted output signal 56 from a Ground Detection Block 57, the input terminal of which is connected to Controlled Ground terminal 46.

Figure 7A:
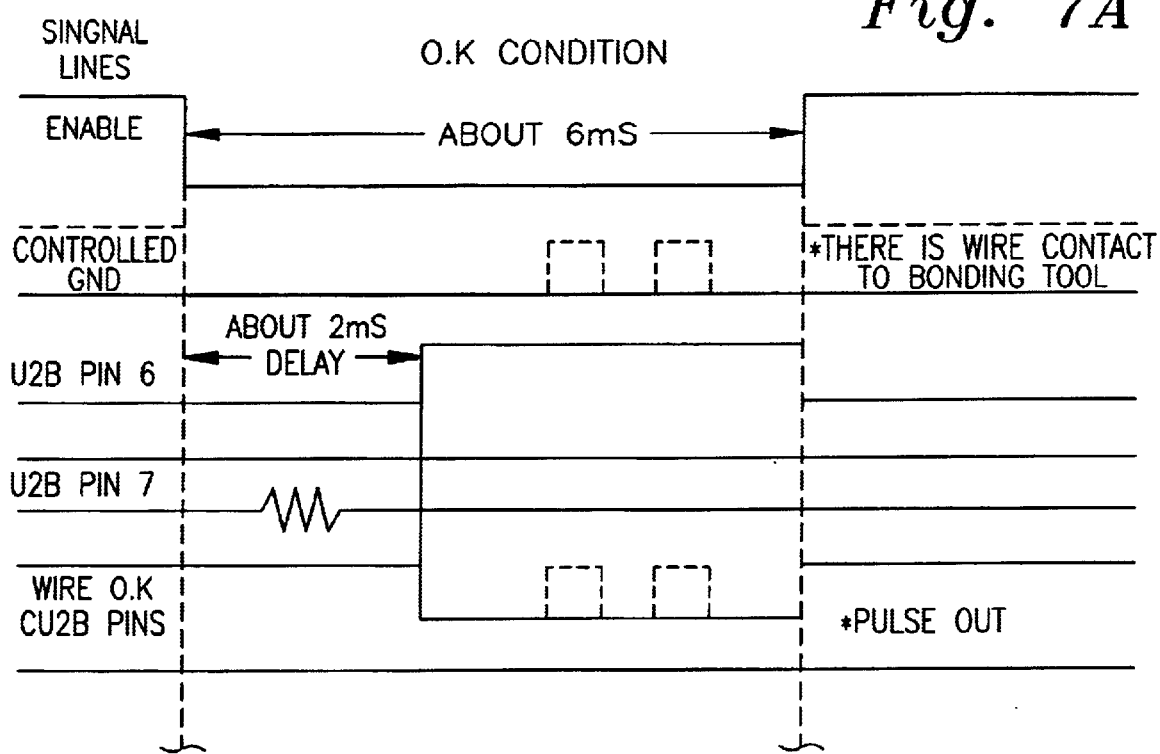
FIG. 7 is a timing diagram showing operation of the module of FIGS. 5 and 6.
Figure 7B:
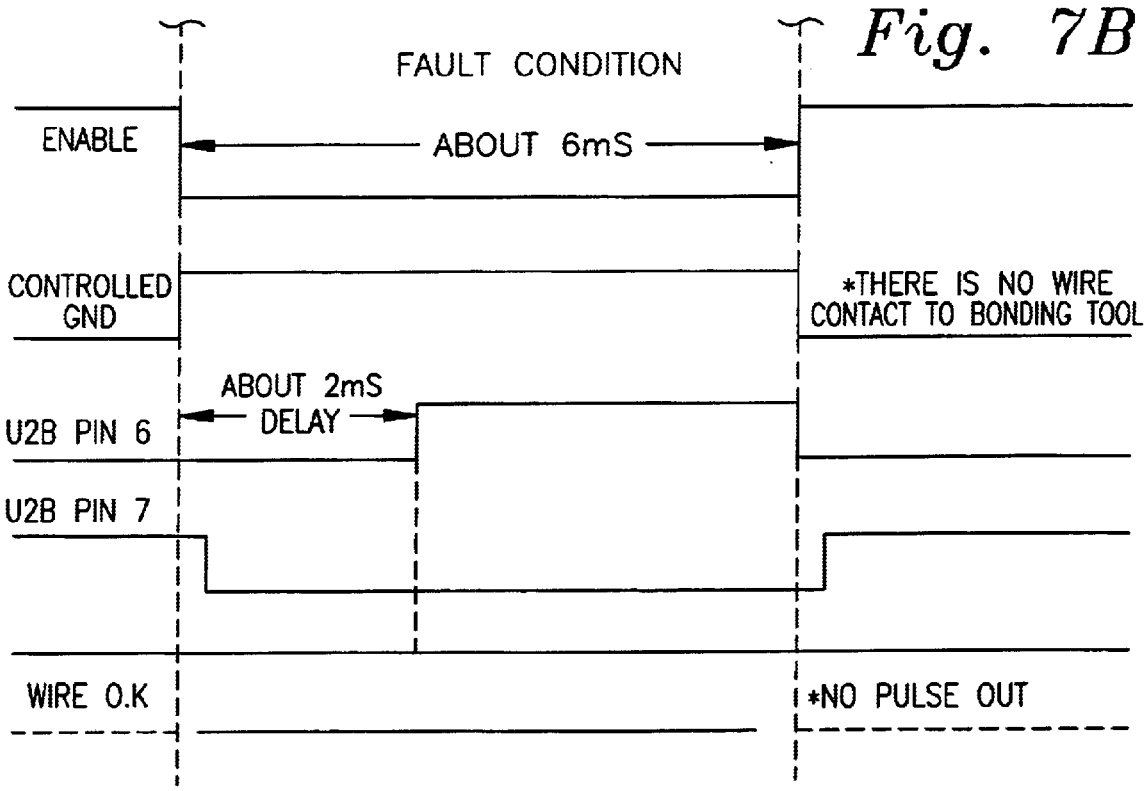

If Controlled Ground terminal 46 goes to a logic low level during the duration of Delayed Enable signal 54, either continuously or intermittently in response to vibrating contact between wire 40 and bonding tool bore wall 36A, NAND gate block 55 outputs a low level, logic TRUE signal on Control Computer WIRE O.K. interface terminal 49, signifying presence of bonding wire 40 within tool bore 36, as shown in FIG. 7A. On the other hand, as shown in FIG. 7B, if tool 28 is not grounded during the TRUE state of Delayed Enable, a positive voltage provided to Controlled Ground terminal 46 through pull-up resistor R4 maintains the Controlled Ground terminal at a high logic TRUE value, causing output signal 56 from Ground Detection Block 57 to go to a low, logic false LEVEL, which in turn causes signal 58 outputted from NAND gate block 55 to WIRE O.K. terminal 49 remains at a high, FALSE level, indicating absence of wire within bonding tool bore 36, as shown in FIG. 7B.

In testing apparatus 20 of FIG. 1 using a shallow angle wedge bonding tool having a shallow wire feed angle of 40 degrees with respect to a workpiece, i.e., 50 degrees with respect to the vertically oriented longitudinal axis of the tool shank, the apparatus never failed to issue an error or fault signal when bonding wire 40 was absent from bore 36 of the tool. With bonding wire 40 present within bore 36 of tool 28, apparatus 20 issued 13 false indications of a broken or missing wire, during the course of 600 bond pair cycles. However, when ultrasonic transducer 25 was energized with normal bonding drive power to vibrate tool 28 while External Enable signal 51 was input to module 44, no false indication of wire 40 being absent occurred during formation of 800 bonding pair cycles.

Figure 8:
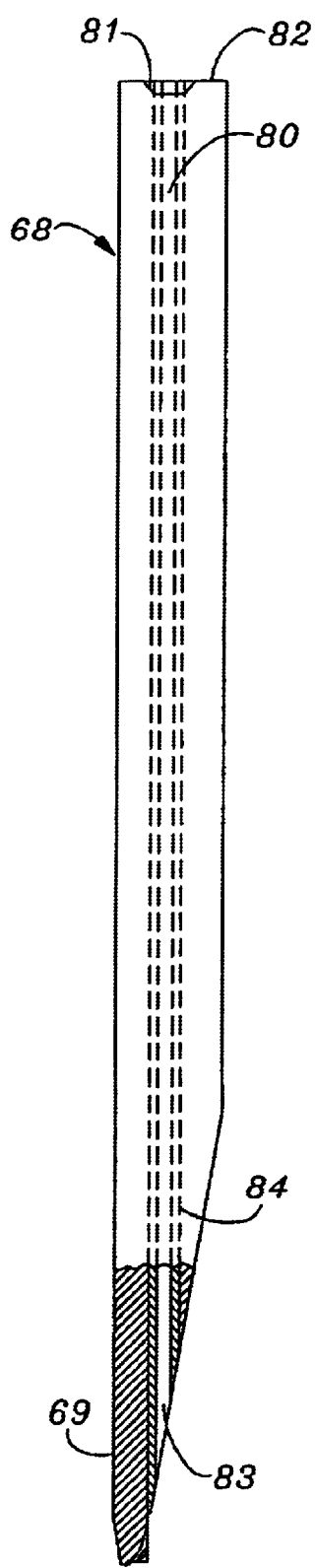
FIG. 8 is a partly sectional view of a deep access wedge bonding tool useable in the broken bonding wire detection apparatus of FIG. 1.
Figure 9:
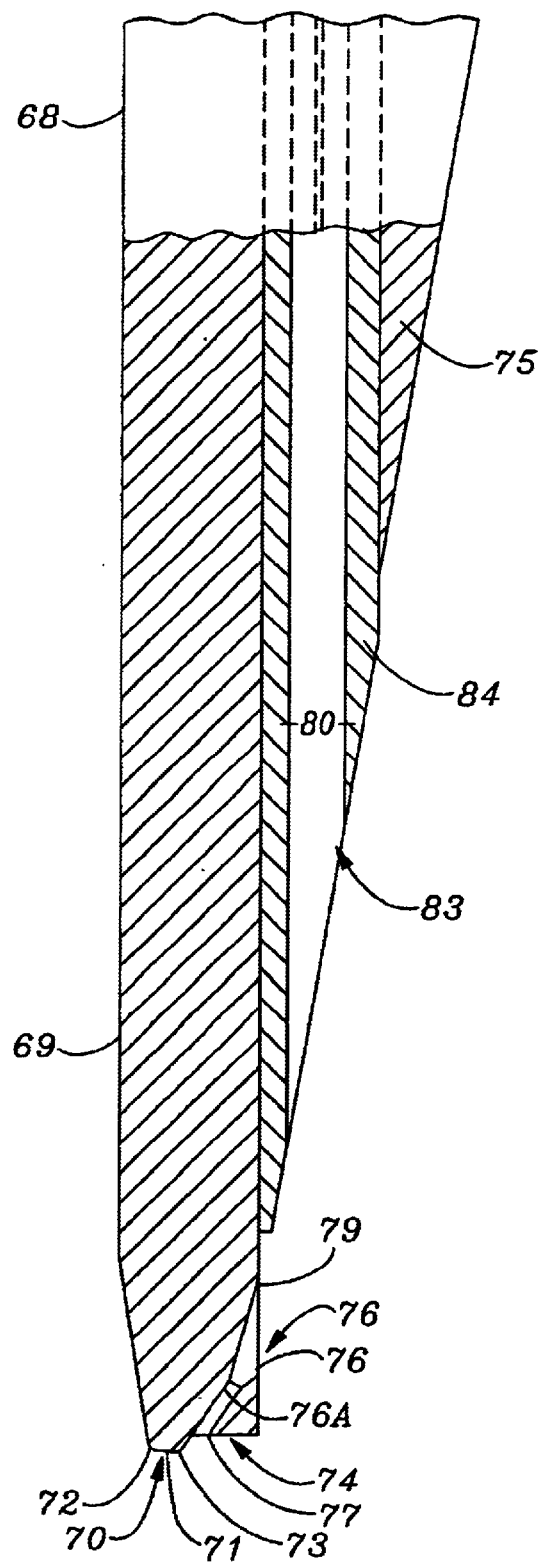
FIG. 9 is a fragmentary view of the deep access wedge bonding tool of FIG. 8, on a further enlarged scale.

FIGS. 8–12 illustrate a deep access wedge bonding tool 68 useable in the apparatus of FIG. 1. As may be seen best by comparing FIG. 9 with FIG. 3, deep access wedge bonding tool 68 has elements 69–79 exactly analogous to elements 29–39, respectively, of shallow access wedge bonding tool 28. As shown in FIGS. 8 and 9, deep access wedge bonding tool 68 also has disposed longitudinally through its shank a wire feed bore 80 which has an upper entrance opening 81 in upper transverse end face 82, and a lower obliquely angled exit opening 83 located diagonally upwardly and rearwardly of tool tip wire bore entrance 78. As shown in FIGS. 8–12, longitudinal wire feed shank bore 80 has secured coaxially therewithin an elongated flexible insulating tube 84, which prevents bonding wire 40 within feed bore 80 from coming into electrically conductive contact with the cylindrical inner bore wall surface 85 of the feed bore.

Figure 10:
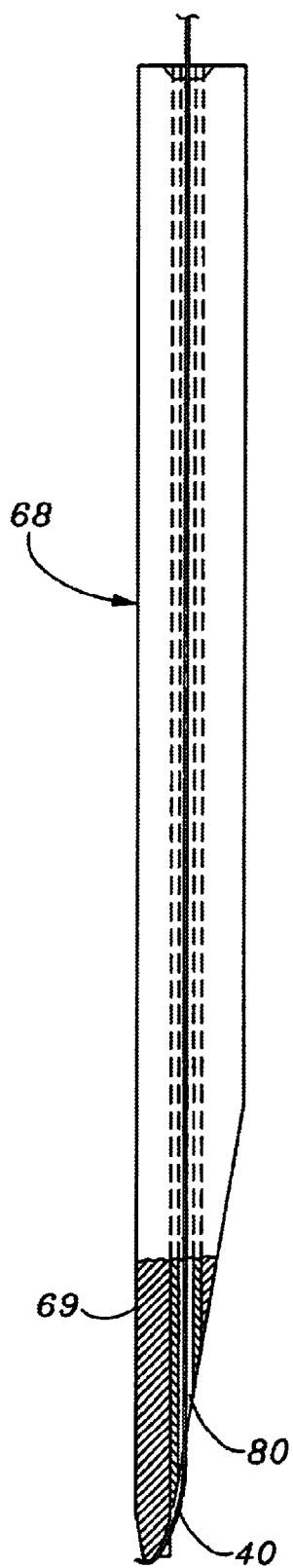
FIG. 10 is a view similar to that of FIG. 8, but showing a bonding wire within bores of the bonding tool.
Figure 11:
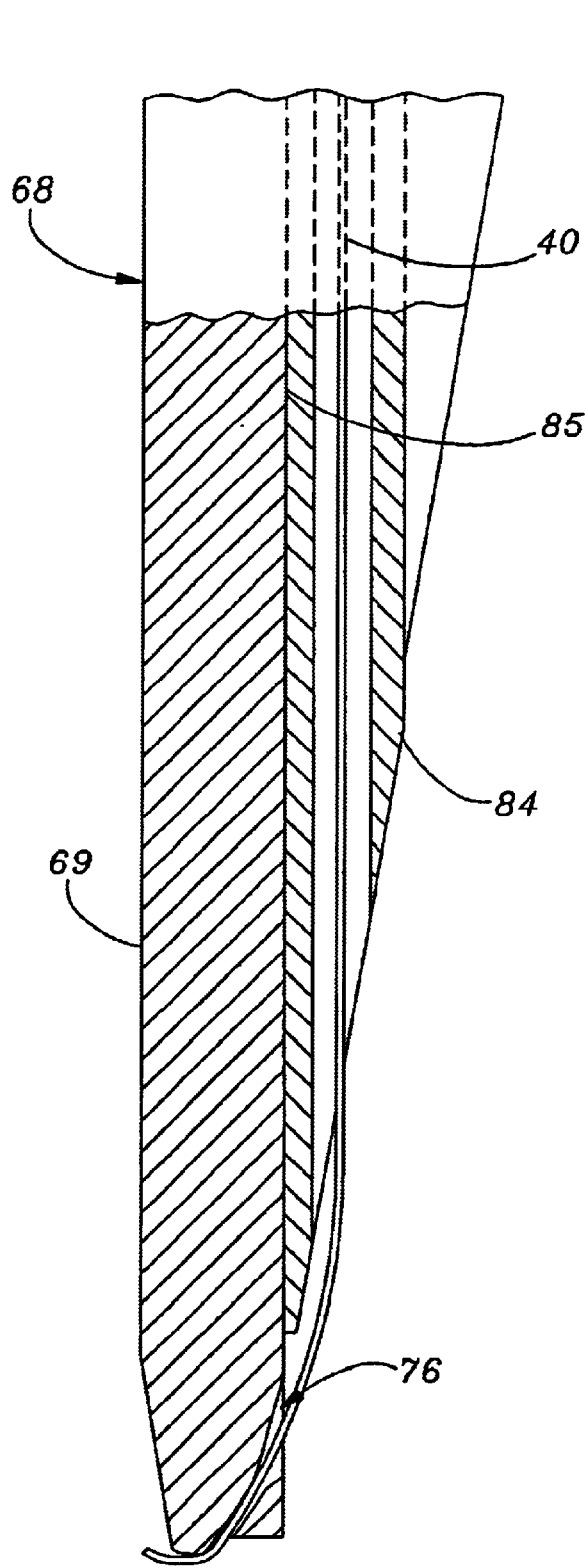
FIG. 11 is a view similar to that of FIG. 10, but on a further enlarged scale.

As shown in FIGS. 10 and 11, bonding wire 80 emerging from lower exit opening 83 of wire feed bore 80 must bend at a relatively small radius to thread into entrance opening 79 of tool tip bore 76. Thus, it has been found by testing, that wire 40 consistently makes electrical contact with inner cylindrical wall surface 76A of tool tip bore 76. Therefore, when a deep access wedge bonding tool such as tool 68 is used in apparatus 20 of FIG. 1, it is not necessary to vibrate the tool to confirm presence of bonding wire 40 within tool tip bore 76.

Figure 12:
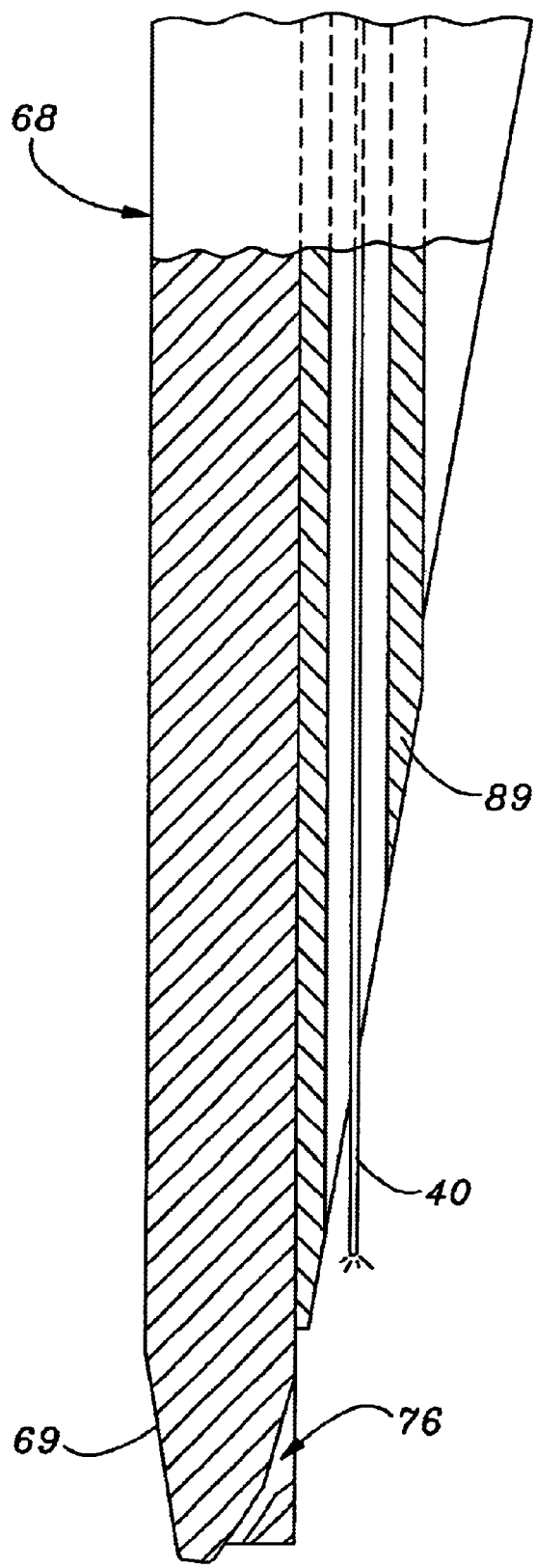
FIG. 12 is a view similar to that of FIG. 11, but showing a bonding wire thereof broken.

FIG. 12 illustrates a bonding wire 40 which has been broken rearward of tool tip bore 76. When electronics and switching and detection module 44 is enabled in that case, the detection module issues a high, logic FALSE signal indicating the absence of the wire, as shown in FIG. 7B.

In an alternate embodiment of the apparatus and method, the ultrasonic bonding tool, rather than the wire, is permanently grounded, and the wire and supply reel are alternately electrically isolated from and connected to ground by the FET switch.

What is claimed is:
1. An apparatus for detecting bonding wire in a bore through an ultrasonic bonding tool tip comprising;
   a. switching means for alternately electrically conductively connecting and disconnecting one of an ultrasonic bonding tool or a source of bonding wire for said tool from a ground terminal electrically conductively connected to the other of said source of bonding wire for said tool or said tool,
   b. continuity detection means for providing a continuity signal if continuity exists between an inner wall surface of said bore through said ultrasonic bonding tool tip and a segment of bonding wire continuous with wire from said source of bonding wire and within said bore of said bonding tool tip,
   c. status signal generator means connected to said continuity detection means for generating a status signal of a first type when continuity is detected, and a status signal of a second type when continuity is not detected, said continuity detection means and said status signal generator means functioning during a time period when said wire source and said tool are electrically conductively disconnected, and
   d. vibrating means for vibrating said bonding tool when said bonding wire source and said tool are electrically conductively disconnected, whereby a wire segment within said tool tip bore and spaced apart from a wall surface of said bore is made to intermittently electrically contact said bore wall surface to thereby indicate continuity, owing to relative motion between the tool and wire caused by movement of said tool and inertia of said wire.

2. The apparatus of claim 1 wherein said continuity detection means is further defined as comprising in combination an electronic logic gate having an input terminal electrically connected through a pull-up impedance element to a voltage source and to one of said tool or said wire, and a ground terminal electrically connected to the other of said wire or said tool, whereupon continuity between a wire segment within said bore of said tip of said tool pulls down voltage at said input terminal of said logic gate to a value low enough to switch the output state of said logic gate.

3. The apparatus of claim 2 wherein said status signal means is further defined as including an electronic logic gate having an input terminal connected to an output terminal of said continuity detector means.

4. The apparatus of claim 3 wherein said switching means is further defined as being responsive to an external ENABLE signal in connecting and disconnecting said bonding wire source from said bonding tool.

5. The apparatus of claim 4 further including time delay means for producing a time-delayed ENABLE signal in response to said external ENABLE signal, said time-delayed ENABLE signal being logically ANDED in said status signal means with said continuity signal to produce said status output signal.

6. The apparatus of claim 5 wherein said switching means is further defined as including a transistor having a first output terminal thereof electrically conductively connected to said bonding wire source, and a second output terminal thereof electrically conductively coupled to said tool.

7. The apparatus of claim 6 wherein said transistor is further defined as being a field effect transistor.

8. The apparatus of claim 1 wherein said means for vibrating said bonding tool is further defined as being an ultrasonic force producing transducer.

9. An apparatus for detecting presence of a bonding wire in a bore through an ultrasonic bonding tool comprising;
   a. switching means having ON and OFF states for alternately electrically conductively connecting and disconnecting, respectively, one of an ultrasonic bonding tool or a source of bonding wire for said tool from a ground terminal electrically conductively connected to the other of said source of bonding wire for said tool or said tool, said switching means being in said ON state during an ultrasonic bonding operation for bonding wire from said bonding tool to a bonding site, on a workpiece, and in said OFF state after said bonding operation,
   b. electrical continuity detection means for determining whether electrical continuity exists between an inner wall surface of said bore through said bonding tool and a segment of said bonding wire within said bore through said bonding tool, said continuity detection means being operative only during said OFF state of said switching means, and
   c. status signal generator means connected to said continuity detection means for generating a status signal of a first type when continuity is detected, and a status signal of a second type when continuity is not detected, whereby
   d. said electrical continuity detection means is operative without application of an electrical potential to or electrical current flow through said workpiece.

10. The apparatus of claim 9 wherein said switching means, said continuity detection means and said status signal generator means are components of a switching and detection electronics module.

11. The apparatus of claim 10 wherein said functions of said electronic module are enabled by an input ENABLE signal input to said module from a controller.

12. The apparatus of claim 11 wherein said continuity detection means is further defined as comprising in combination; an electronic logic gate having an input terminal electrically connected through a pull-up impedance element to a voltage source and to one of said tool or said wire, and a ground terminal electrically connected to the other of said supply wire or said tool, whereupon continuity between a wire segment within said bore of said tip of said tool pulls down voltage at said input terminal of said logic gate to a value low enough to switch the output state of said logic gate.

13. The apparatus of claim 12 wherein said status signal means is further defined as including an electronic logic gate having an input terminal connected to an output terminal of said continuity detector means.

14. The apparatus of claim 13 wherein said switching means is further defined as being responsive to an external ENABLE signal in connecting and disconnecting said bonding wire source from said bonding tool.

15. The apparatus of claim 14 further including time delay means for producing a time-delayed ENABLE signal in response to said external ENABLE signal, said time-delayed ENABLE signal being logically ANDED in said status signal means with said continuity signal to produce said status output signal.

16. The apparatus of claim 15 wherein said switching means is further defined as including a transistor having a first output terminal thereof electrically conductively connected to said bonding wire source, and a second output terminal thereof electrically conductively coupled to said tool.

17. The apparatus of claim 16 wherein said transistor is further defined as being a field effect transistor.

18. The apparatus of claim 17 wherein said means for vibrating said bonding tool is further defined as being an ultrasonic force producing transducer.

19. A method for detecting bonding wire within a bore on an ultrasonic bonding tool comprising the steps of;
   a. electrically isolating for a period of time one of an ultrasonic bonding tool through a source for supplying bonding wire to said tool from a ground in electrically conductive contact with the other of said bonding wire or said bonding tool from said source for supplying bonding wire to said tool,
   b. determining during said isolation time period whether electrical continuity exists between said bonding wire source and said tool, by virtue of electrical contact between an inner wall surface of said bore through said tool and a segment of said wire located within said bore and continuous with said wire from said supply source, and
   c. generating an in-tolerance status signal upon detecting said continuity, and a fault signal upon not detecting said continuity.

20. The method of claim 19 further including the step of re-establishing electrically conductive contact between said tool and said wire upon completing said continuity determination.

21. The method of claim 20 wherein said recited steps are performed prior to utilizing said ultrasonic bonding tool to make a first bond of a pair of bonds.

22. The method of claim 21 further including the step of vibrating said ultrasonic bonding tool during said continuity-determining step, whereby a wire segment within said tool tip bore but spaced apart from a wall surface thereof is made to intermittently contact a bore wall surface to thereby establish continuity between said wire segment and said tool.

23. An apparatus for detecting presence of a bonding wire fed through a longitudinally disposed, elongated supply bore in an elongated shank of an ultrasonic bonding tool into an angled lower wire feed bore of said tool, said apparatus comprising;
   a. electrically non-conductive insulating means located within said longitudinally disposed, elongated wire supply bore of said tool, for preventing electrically conductive contact between said bonding wire and an inner wall surface of said wire supply bore, b. switching means having ON and OFF states for alternately electrically conductively connecting and disconnecting, respectively, one of an ultrasonic bonding tool or a source of bonding wire for said tool from a ground terminal electrically conductively connected to the other of said source of bonding wire for said tool or said tool, said switching means being in said ON state during an ultrasonic bonding operation for bonding wire from said bonding tool to a bonding site on a workpiece, and in said OFF state after said bonding operation, c. electrical continuity detection means for determining whether electrical continuity exists between an inner wall surface of said angled lower wire feed bore of said tool and a segment of said bonding wire within said feed bore through said bonding tool, said continuity detection means being operative only during said OFF state of said switching means, and d. status signal generator means connected to said continuity detection means for generating a status signal of a first type when continuity is detected, and a status signal of a second type when continuity is not detected, whereby e. said electrical continuity detection means is operative without application of an electrical potential to or electrical current flow through said workpiece.

* * * * *